United States Patent [19]

Hine

[11] Patent Number: 4,892,455
[45] Date of Patent: Jan. 9, 1990

[54] WAFER ALIGNMENT AND TRANSPORT MECHANISM

[76] Inventor: Derek L. Hine, 5 Hawk View, Portola Valley, Calif. 94025

[21] Appl. No.: 323,207

[22] Filed: Mar. 13, 1989

Related U.S. Application Data

[63] Continuation of Ser. No. 52,496, May 21, 1987, abandoned.

[51] Int. Cl.⁴ .............................................. B65G 1/06
[52] U.S. Cl. .................................. 414/417; 414/331; 414/433; 414/757; 414/786
[58] Field of Search ............... 414/331, 786, 431–433, 414/417, 754, 757, 741, 751, 225; 901/8; 195/468.2

[56] References Cited

U.S. PATENT DOCUMENTS

| | | | |
|---|---|---|---|
| 3,160,295 | 12/1964 | Roark | 414/331 |
| 3,820,647 | 6/1974 | Waugh, Jr. et al. | 414/757 X |
| 4,094,426 | 6/1978 | Vogel | 414/431 |
| 4,213,318 | 7/1980 | Priebe | 414/757 X |
| 4,427,332 | 1/1984 | Manriquez | 414/331 |
| 4,449,885 | 5/1984 | Hertel et al. | 414/417 X |
| 4,621,967 | 11/1986 | Masada | 414/331 X |
| 4,655,584 | 4/1987 | Tanaka et al. | 414/754 X |
| 4,662,811 | 5/1987 | Hayden | 414/433 |
| 4,691,817 | 9/1987 | Haar | 414/225 X |

FOREIGN PATENT DOCUMENTS 3004462 8/1981 Fed. Rep. of Germany ...... 414/757

Primary Examiner—David A. Bucci
Attorney, Agent, or Firm—Timothy H. P. Richardson

[57] ABSTRACT

A precise alignment mechanism combined with a transport mechanism for silicon wafers, that handles the wafers by the edges only, in order to eliminate the potential for surface damage or contamination of the wafers. The preferred embodiment of the invention works with wafers that are approximately prealigned in the cassettes before handling. A second embodimenmt can work with randomly aligned wafers. An improvement for high production or continuous operation adds a multiple cassette input to the invention.

9 Claims, 2 Drawing Sheets

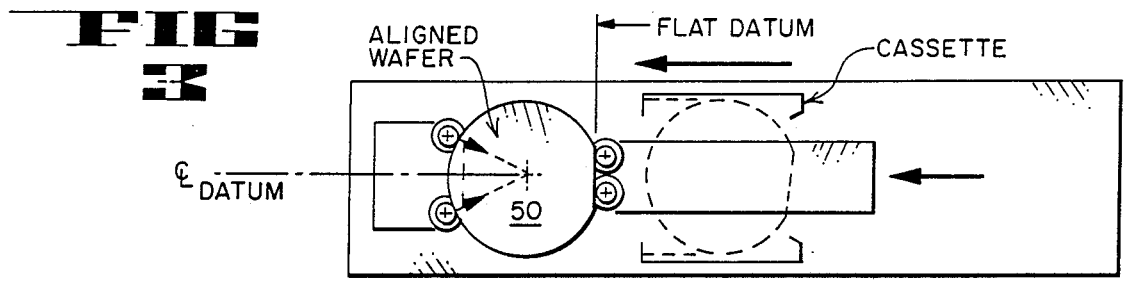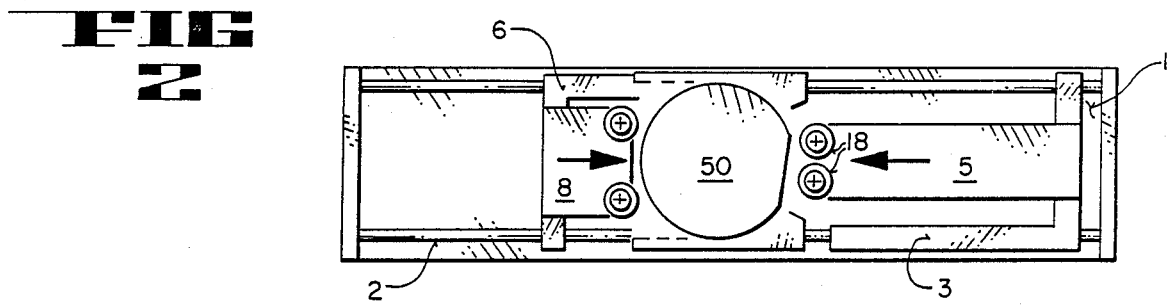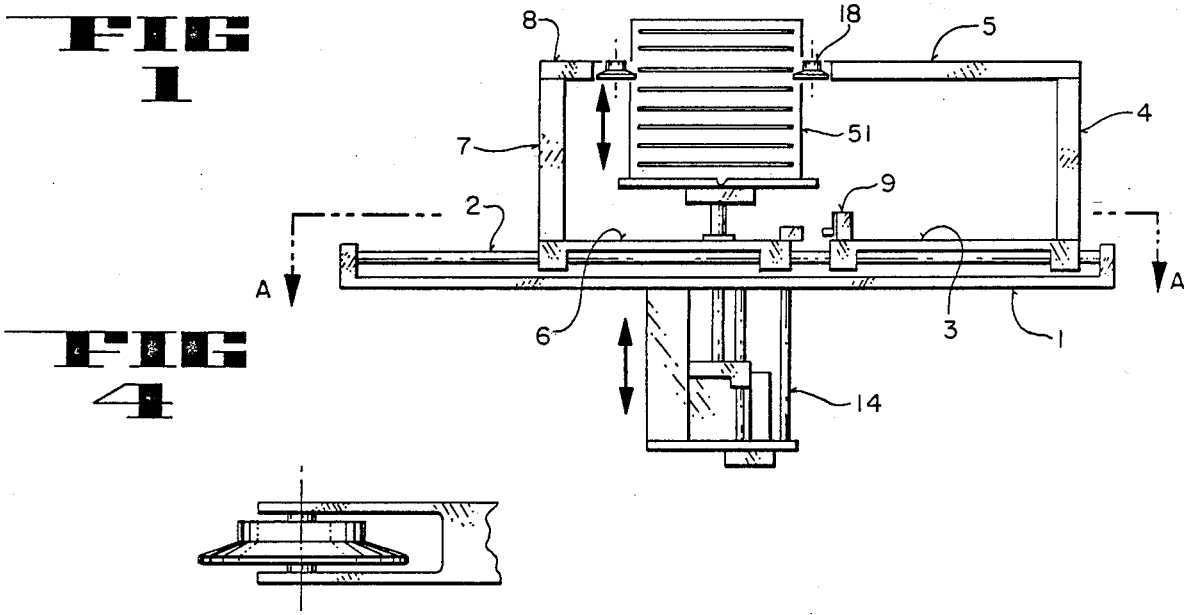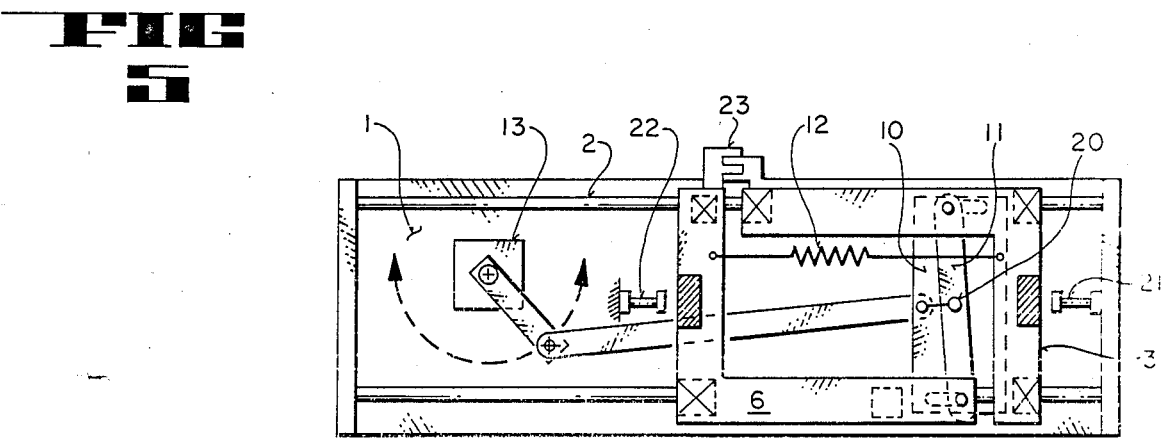

WAFER ALIGNMENT AND TRANSPORT MECHANISM

CROSS-REFERENCE TO RELATED APPLICATION

This application is a file wrapper continuation under 37 CFR 1.62 of copending application Ser. No. 07/052,496, filed May 21, 1987, now abandoned.

BACKGROUND OF THE INVENTION

1. Field of the Invention

This invention relates to appparatus for transporting and aligning silicon wafers or the like and methods of using such apparatus.

2. Introduction to the Invention

In the manufacture of solid state devices, silicon wafers are moved between different work stations, usually in cassettes which hold a number of wafers stacked one above the other in horizontal pockets, each pocket formed of a generally U-shaped groove into which the wafer can be placed. Careful handling of the wafers is essential.

It is now often preferred that neither face of the wafer makes contact with the handling device; also, many processes require that the wafer has a known orientation with respect to a flat or notch on the perimeter of the wafer that defines its crystaline plane.

Manually operated devices are presently available and in use that can align the flats or notches on wafers while in their cassettes to approximately the same orientation. It is required that such approximate prealignment is used in the preferred embodiment of this invention.

No currently used wafer transport or alignment device was found to have the same attributes as those described by this invention.

This invention provides a means for simultaneously precisely aligning 'approximately prealigned' wafers, with either flats or notches, during transportion from the cassette to another defined location, without touching either face of the wafer. It is also shown how, with an optional motor fitted, the device can precisely align randomly oriented wafers and lastly how the device can be incorporated into a multiple cassette, high throughput production machine facilitating continuous automatic operation.

SUMMARY OF THE INVENTION

I have discovered an improved transport and precise alignment mechanism which incorporates two 'presenter' jaws, each of which carries at least two freely rotatable flanged wheels that can rotate in the plane of the wafer. The jaws are moved in a linear fashion so that the two pairs of wheels encircle the wafer, lifting and supporting it by the sloping flanges on the wheels. The pairs of wheels are spring loaded towards each other so that while one pair of wheels locates the flat the other pair centers the wafer on a line perpendicular to the flat. With a spring loaded pin fitted between one pair of wheels, a notched wafer can be similarly oriented.

The jaw with the wheels that contact the wafer from behind the cassette is made flat and thin enough to clear the wafers above and below the one being transported, and are made long enough to clear the other wafers and the cassette during transport.

A pin, mounted on a spring loaded arm is fitted between one of the pairs of wheels to locate the notch in a notched wafer. The other pair of wheels are still used to center the wafer, as before.

In the event that the notch is not oriented with enough precision to be engaged by the pin, a motor can be added to drive one or more of the wheels to rotate the wafer until the pin drops into the notch. When the pin is properly located its arm moves towards the wafer and activates a sensor that switches off the motor that rotates the wafer.

It has been determined that the pair of wheels aligned with the flat can tolerate more than ±-10 degrees of error and still precisely locate the flat. For randomly oriented wafers the wafer can be rotated with a motor, as above, to find the flat.

The yoke carrying the wheels can be configured with horizontal or vertical support structure.

If configured vertically it is possible to provide the necessary clearance to transport cassettes laterally (horizontally and perpendicular to the presenter motion) through the yoke/presenter mechanism when its jaws are open. This facilitates providing a 'buffer' of one or more additional cassettes to allow continuous machine operation. 'Processed' cassettes, not located at the elevator 'work' station, can then be exchanged with 'unprocessed' cassettes during normal machine operation. If the presenter structure is configured horizontally a more compact mechanism can be designed but it is restricted to single cassette operation.

By suitable juxtaposition of; a lever connecting the two yokes; a free sliding slotted plate that transmits the motion from the linear actuator to the yokes while allowing limited movement between the yokes and adjustable end stops that limit the movement of the middle of the lever, it is possible, with a single continuous linear motion input to;

first, close the jaws to locate, orient and pick up the wafer at the 'home' location in the cassette;

second, move the wafer out of the cassette to the desired 'work' location and third; if required, to open the jaws and release the wafer at the 'work' location.

Transport mechanisms for silicon wafers currently in use that attempt to achieve the same results as this invention have the following disadvantages;

1. They contact or otherwise contaminate at least one surface of the wafer during handling.
2. They use separate complex flat finders or notch finders, devices for orienting the wafers, that require more space, cost and handling time and again involve surface contact with the wafer.
3. Existing flat finders are inherently less repeatable and slower than the simple device described in this invention.

BRIEF DESCRIPTION OF THE DRAWINGS

The invention is illustrated by the following drawings in which:

FIG. 1 is a side view of the presenter apparatus of the invention.

FIG. 2 is a plan view of apparatus in FIG. 1. depicting an approximately aligned wafer in a cassette ready to be precisely aligned and transported or 'presented'.

FIG. 3 is a plan view, like FIG. 2, but showing the wafer precisely aligned and presented.

FIG. 4 is a detailed side view of one of the flanged wheels shown in FIGS. 1, 2 and 3.

FIG. 5 is a cut away plan view of apparatus in FIG. 1 showing a linear actuator, and jaw opening mechanism, that operates at the ends of travel when the lever fulcrum reaches a stop.

DETAILED DESCRIPTION OF THE INVENTION

A preferred embodiment of the invention is an apparatus which comprises;

(1) A mounting plate, (FIG. 1, Item 1)

(2) Fixed linear ways, or slides, on the mounting plate, (FIG. 1, Item 2)

(3) A first yoke which can slide with a linear motion along the ways, (FIG. 1, Item 3).

(4) A first riser (FIG. 1, Item 4) fixed to the first yoke (Item 3) and tall enough to reach the top slot of a cassette whose supporting platform is above the sliding parts of the yoke.

Figure 6:
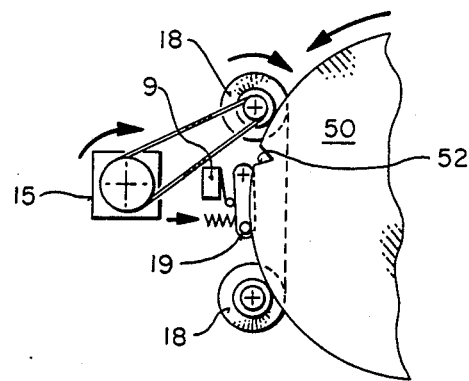
FIG. 6 is a partial plan view of an optional wafer rotation device for orienting nonprealigned wafers.

(5) A first presenter jaw (FIG. 2, Item 5) fixed at one end to the first riser (4) and carrying at the other end either, two freely rotatable flanged wheels (FIG. 1, Item 4) and shown in detail in FIG. 4) that are mounted to rotate in the same plane as the wafer and fitting between the top and bottom surfaces of the presenter jaw OR a freely rotatable or fixed pin (FIG. 6, Item 19) spring loaded towards the wafer and mounted between a pair of flanged wheels.

The first presenter jaw is designed flat and thin in order to move freely between the adjacent wafers in a cassette when aligned with the plane of any wafer in that cassette 51. It is also designed long enough to move, with the wafer, out of the cassette to the 'work' location required for the particular application without causing interference between the wafers or the cassette and the mechanism.

(6) A second yoke (FIG. 1, Item 6) that can slide with a linear motion along the same, or parallel, ways as the first yoke.

(7) A second riser (FIG. 1, Item 7) as tall as the first and fixed to the second yoke.

(8) A second presenter (FIG. 1, Item 8) fixed at one end to the second riser (Item 7) and carrying at the other end two freely rotatable flanged wheels that rotate in the same plane as the wafer OR a spring loaded pin (FIG. 4, Item 19) in addition to the pair of wheels. The edge of this presenter assembly that overlaps the wafer is also thin enough to fit between the adjacent wafers.

Whereby a wafer, approximately aligned in a cassette may be indexed to the plane of the presenter so that when activated the presenter jaws close around the wafer from both sides. As the flanged wheels contact the wafer the sloped flanges on the wheels lift the wafer to the middle of the cassette slot and as the perimeter of the wheels contact the wafer it is precisely aligned and centered as the wheels move closer together under spring tension. When hard contact is made by all four wheels the wafer is located and aligned, continued motion by the linear actuator moves the wafer out of the cassette to the work station.

(9) A detector switch (FIG. 1, Item 9) mounted between the yoke/presenter assemblies and adjusted to switch only when the flat is correctly aligned, which is the only condition permitting correct closure of the presenter 'jaws', (or is mounted to the locator pin assembly for notch finding). It is used to either;
  1. to signal a default to the host system if the flat or notch is not located, or
  2. start the above optional motor (FIG. 6 Item 15), if fitted, to 'find' the flat or notch.

(10) A slotted plate (FIG. 5, Item 10), that can slide on the same ways, or ways parallel to those used by the yokes, that is attached near the middle along its width to the linear actuator (FIG. 5, Item 13) and at its ends via the slots to each of the yokes. The slots are sized and positioned to allow limited lengthwise motion between the yokes. This limits the opening of the jaws.

(11) A lever, (FIG. 5 Item 11), located laterally between and attached at its ends to each of the yoke assemblies (Items 3 and 6) with a cam follower bearing (FIG. 5, Item 20) fixed along its length that aligns with fixed stops at each end of the travel and acts as a fulcrum. Its function is to move the yoke assemblies in opposite directions, and thus opens the jaws when its fulcrum reaches a stop while the linear actuator (Item 13) continues to move one end of the lever via the slotted plate (Item 10)) and so opens the jaws.

(12) A tension spring (FIG. 5 Item 12) or equivalent device is attached at its ends to each of the yoke assemblies in order to pull them towards each other with a light and controlled force. This force is sufficient to securely hold a wafer placed between the flanged wheels on the presenter ends without causing it damage. It also resists the inertia forces that tend to open the jaws during movement.

For better control of this force, which must be changed for different wafer sizes, an air cylinder can be used, instead of a spring, in which the air pressure may be adjusted to achieve the closure force desired.

(13) A linear actuator (FIG. 5, Item 13) is used to drive the yoke assemblies back and forth. It may be; a pneumatic or hydraulic cylinder or a motor driven crank with connecting rod, or with a lead screw or any similar device that has the necessary stroke, force and acceleration characteristics.

(14) An elevator, (FIG. 1. Item 14), fixed to the mounting plate that can index a cassette loaded with wafers so that each wafer in turn is positioned into the plane of the presenter.

(15) An optional motor assembly (FIG. 6 Item 15) is mounted on the second presenter (Item 8) so that it can rotate one or more of the flanged wheels which in turn rotate the wafer fo 'find' a notch or a flat. This is used when prealignment is not used or is not sufficiently accurate to locate the flat or notch automatically.

More flanged wheels may be added to either presenter assembly, positioned to fit the perimeter of the wafer and contain it during rotation for flat finding. The extra locating wheels can be lightly spring loaded towards the wafer.

Both of the presenter assemblies (Items 5 and 8) are designed to be quickly exchanged with others in order to handle different sizes and styles of wafers or different locations of flats or notches.

(16) An optional magnetic clutch (FIG. 5, Item 23) or similar device can be interposed between the yoke assemblies that activates when it is sensed that the wafer is properly located and supported by the presenter assemblies and linear motion of the yoke/presenter assembly is about to commence. This permits faster accelerations to be used without accidentally releasing or damaging the wafer due to inertia and friction forces applied by the yoke/presenter assemblies.

(17) If required for high throughput or continuous operation a lateral transport can be added that can transport two or more cassettes laterally (horizontally and perpendicular to the presenter axis), in turn, into and out of the presenter assembly work station. A vertically configured presenter support structure must be used with this arrangement to provide the necessary clearance for the lateral cassette movement.

Figure 7:
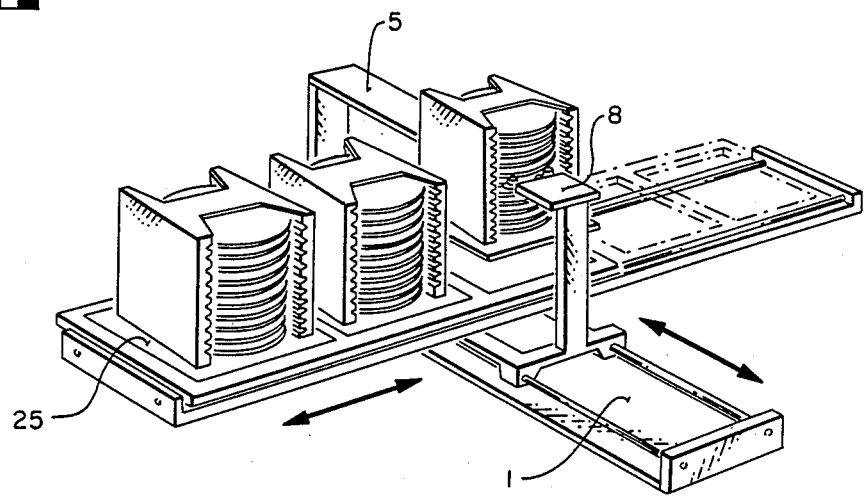
FIG. 7 depicts the optional, multi cassette transport mechanism.
Figure 8:
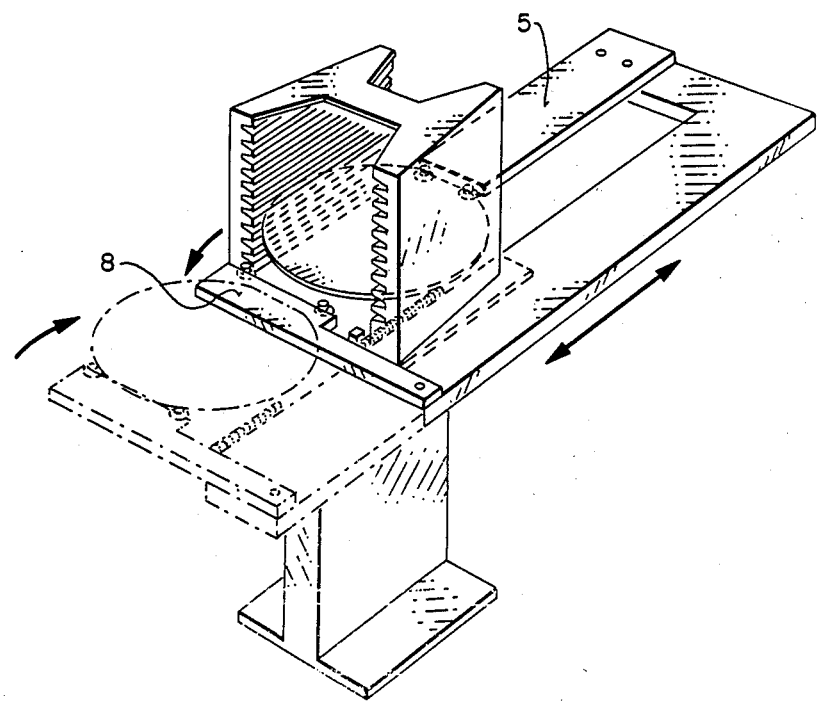
FIG. 8 illustrates an alternative horizontally configured presenter support structure.

The lateral cassette transport locates the cassettes on platforms (FIG. 7, Item 25) that fit into nests in a frame that can be indexed to position each cassette, in turn, over the elevator (14). The platform with its cassette is lifted by the elevator to index each wafer in turn to the operating height of the presenter.

During the cassette exchange operation the elevator must be in the fully lowered 'home' position where it leaves its cassette supported on the open frame and the presenter jaws must be fully open at the cassette end of its travel or its 'home' position.

OPERATION OF THE INVENTION

In the preferred configuration a cassette is positioned on the elevator (14) and is loaded with wafers which are approximately prealigned. The presenter (Items 5 and 8) is parked in its 'home', open position at the cassette end of its travel. The first wafer can then be indexed into position in the plane of the presenter by the elevator (14).

The linear actuator (13) starts its movement from 'home', where the fulcrum of the lever (11) had been hard against the home stop (21), causing the spring (12) to be stretched and the presenter 'jaws' to be open. As the linear actuator moves the slotted plate (10) this permits the lever (11) to rotate, and the spring (12) to contract, thus moving the first yoke with its presenter towards the wafer. The second yoke (6) and presenter (8) are moved towards the wafer from the other side by the other end of the lever (11) under the same spring force. This causes the wafer to be lifted by the tapered flanges of the wheels (18) in the ends of the presenter and as the perimeter of the wheels close on the outside diameter of the wafer the flat (or notch) is automatically aligned and the wafer is centered as the pairs of wheels move together under the spring force (12). When the wheel perimeters are in close contact with the wafer they stop moving closer together. At this point the 'aligned' detector switch (9) is activated indicating that the flat is correctly located.

If the flat is not located at this point, the jaws will not properly close which causes the detector switch to send a signal to the host control system as the presenter passes the wafer pick up location. The control system will first switch off the linear actuator (13) then, if fitted with the optional motor (15), it is switched on to rotate the wafer until it is oriented and detected by detector switch (9). This triggers the control system to continue the operation. If not fitted with a the optional motor, the linear actuator is stopped and a default signal sent to the host.

Continued movement of the linear actuator causes the wafer to be moved out of the cassette. While the complete assembly of two yokes with their respective presenters and the wafer move out, the yokes are actually being held together by the spring (12) and held apart by the wafer.

If rapid motion is required, the inertia and friction of the first presenter could overcome the sprig tension that is holding the yokes together. This could either cause the wafer to be released during travel or at the other end of travel could apply too much compressive force on the wafer thereby causing damage. In this case a magnetic or similar brake (23) is necessary to lock the yokes in their relative positions when triggered by the closure sensing switch (9).

The presenter and supporting yoke, riser assemblies can be constructed with the necessary clearances to allow cassettes located on platforms to be transported laterally into and out of the presenter work station. The cassette transporting mechanism can be automated to allow continuous machine operation while 'processed' cassettes are exchanged by an operator or robot cassette loader. When such a cassette, with platform, is positioned in the work station the elevator engages and lifts the platform to index each wafer in turn into the operating plane of the presenter.

I claim:

1. A method of transporting an individual silicon wafer which is in the form of a generally circular disk having a plane, a periphery, and a center, which method comprises supporting the wafer solely by means of wafer supports which contact the wafer only around the periphery thereof, and moving the wafer, while it is supported and contacted only by the wafer supports, until it has a desired alignment, and in which method (a) the wafer supports comprise first and second pairs of wheels which are rotatable in the plane of the wafer, the wheels of the first pair of wheels having axes of rotation which lie in a first plane and the wheels of the second pair of wheels having axes of rotation which lie in a second plane; the first plane is maintained parallel to the second plane; and the center of the wafer lies between the two pairs of wheels; and (b) the first and second pairs of wheels are urged towards each other and thereby align the wafer so that its center lies on a line joining (a) the mid point of a line joining the axes of the wheels of the first pair in the plane of the wafer and (b) the mid point of a line joining the axes of the wheels of the second pair in the plane of the wafer.

2. A method according to claim 1 wherein the wafer is in the form of a generally circular disc having on its periphery an alignment flat which is a chord of the disc or an alignment notch, and the wafer supports are moved so as to rotate the wafer into a desired rotational alignment.

3. Apparatus which is suitable for transporting an individual silicon wafer which is in the form of a generally circular disk having a plane, a periphery, and a center, and which apparatus comprises (1) a mounting frame;

(2) at least two wafer carriers which
  (a) are movably mounted on the frame
  (b) comprise a plurality of wafer supports, and
  (c) can be moved relative to each other between (i) a closed position in which a wafer to be transported can be supported solely by contact between the periphery of the wafer and the wafer supports and (ii) an open position in which a wafer to be aligned can be passed freely between the wafer carriers;

(3) closing means which continuously and resiliently urges the wafer carriers toward the closed position, and (4) motion-controlling means which (i) when the wafer carriers are in the open position, can overcome the force exerted by the closing means, and (ii) can be operated to permit the wafer carriers to move in a controlled manner into the closed position.

4. Apparatus according to claim 3 wherein the wafer supports comprise rotatable wheels which rotate in the plane of a wafer to be aligned.

5. Apparatus according to claim 4 wherein at least some of the wheels comprise flanges which are inclined to the axis of rotation of the wheel so that when the wafer carriers move from the open position to the closed position with a wafer between the wafer supports, the wafer moves up the flanges in a direction at right angles to the plane of the wafer.

6. Apparatus according to claim 3 which is adapted to transport an individual wafer from a stack of spaced-apart, parallel wafers in a casssette, wherein the wafer supports comprise rotatable wheels which rotate in a plane whic is parallel to planes of the wafers, and wherein there are two wafer carriers, each of said wafer carriers comprising (a) a yoke which is slidable mounted on the frame, (b) a riser which is secured to the yoke and extends outwardly from the yoke for a distance greater than a corresponding dimension of the cassette, and (c) a presenter which is secured to the riser and on which at least two of the wheels are mounted; the presenters and the wheels mounted thereon being thin enough to fit between adjacent wafers in the cassette when the wafer carriers are moved from the open position to the closed position.

7. Apparatus according to claim 6 which is adapted to extract a wafer from a cassette and to ddeliver it to a location outside the cassette, and which further comprises (6) means for moving the wafer carriers between (i) a pick-up location at which a wafer in the cassette can be picked up and (ii) a release location at which a wafer carried by the wafer carriers is completely outside the cassette and at which the wafer carriers can be moved into the open position to release the wafer.

8. Apparatus according to claim 7 wherein each of the presenters has a pair of rotatable wheels mounted thereon, the wheels on one of the presenters having axes of rotation which lie in a first plane and the wheels on the other presenter having axes of rotation which lie in a second plane, and the first and second planes are maintained parallel to each other as the wafer carriers move between the open and closed positions.

9. Apparatus according to claim 8 wherein the wafer supports can be moved to rotate a wafer supported by them into a desired rotational alignment and which further comprises (7) means for determining when a wafer supported by the wafer supports has a desired rotational alignment.

* * * * *